(12) United States Patent
Chen et al.

(10) Patent No.: US 11,599,785 B2
(45) Date of Patent: Mar. 7, 2023

(54) INFERENCE FOCUS FOR OFFLINE TRAINING OF SRAM INFERENCE ENGINE IN BINARY NEURAL NETWORK

(71) Applicant: INTERNATIONAL BUSINESS MACHINES CORPORATION, Armonk, NY (US)

(72) Inventors: Chia-Yu Chen, White Plains, NY (US); Jui-Hsin Lai, White Plains, NY (US); Ko-Tao Lee, Yorktown Heights, NY (US); Li-Wen Hung, Mahopac, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1150 days.

(21) Appl. No.: 16/188,922

(22) Filed: Nov. 13, 2018

(65) Prior Publication Data

US 2020/0151556 A1    May 14, 2020

(51) Int. Cl.
| | |
|---|---|
| G11C 16/04 | (2006.01) |
| G06N 3/08 | (2023.01) |
| G06N 5/04 | (2023.01) |
| G11C 11/419 | (2006.01) |
| G11C 11/412 | (2006.01) |

(52) U.S. Cl.
CPC .............. G06N 3/08 (2013.01); G06N 5/04 (2013.01); G11C 11/412 (2013.01); G11C 11/419 (2013.01)

(58) Field of Classification Search
CPC ............................ G11C 11/412; G11C 11/419
See application file for complete search history.

(56) References Cited

U.S. PATENT DOCUMENTS

| | | | |
|---|---|---|---|
| 9,111,222 B2 | 8/2015 | Aparin | |
| 9,224,091 B2 | 12/2015 | Arsovski | |
| 11,170,290 B2 * | 11/2021 | Hoang | ..................... G11C 11/54 |
| 2016/0358067 A1 | 12/2016 | Brezzo et al. | |
| 2018/0189637 A1 | 7/2018 | Amir et al. | |

(Continued)

FOREIGN PATENT DOCUMENTS

| | | |
|---|---|---|
| CN | 106909970 | 6/2017 |
| CN | 107153873 | 9/2017 |

OTHER PUBLICATIONS

Anonymous, ip.com, "Branching Neural Networks", IP.com No. IPCOM000254791D, IP.com Electronic Publication Date: Aug. 2, 2018, 11 pages.

(Continued)

*Primary Examiner* — Pho M Luu
(74) *Attorney, Agent, or Firm* — Tutunjian & Bitetto, P.C.; Randy Emilio Tejeda

(57) ABSTRACT

A Static Random Access Memory (SRAM) device in a binary neural network is provided. The SRAM device includes an SRAM inference engine having an SRAM computation architecture with a forward path that include multiple SRAM cells. The multiple SRAM cells are configured to form a chain of SRAM cells such that an output of a given one of the multiple SRAM cells is an input to a following one of the multiple SRAM cells. The SRAM computation architecture is configured to compute a prediction from an input.

19 Claims, 11 Drawing Sheets

(56) References Cited

U.S. PATENT DOCUMENTS

2018/0315473 A1* 11/2018 Yu .......................... G06N 3/063
2021/0390383 A1* 12/2021 Gu .......................... G06N 3/04

OTHER PUBLICATIONS

Andri et al., "YODANN: An Ultra-Low Power Convolutional Neural Network Acelerator Based on Binary Weights", Researchgate, Jun. 2016, 7 pages.
Geier et al., "Solution-processed Carbon Nanotube Thin Film Complementary Static Random Access Memory", PubMed—NCBI, Nat Nanotechnol, Nov. 2015, 2 pages.
Li et al., "TernaryWeight Networks", arXiv:1605.04711v1 [cs.CV] May 16, 2016, pp. 1-9.
Merolla et al., Deep Neural Networks are Robust to Weight Binarization and Other Non-Linear Distortions, arXiv:1606.01981v1 [cs.NE] Jun. 7, 2016, pp. 1-10.

* cited by examiner

INFERENCE FOCUS FOR OFFLINE TRAINING OF SRAM INFERENCE ENGINE IN BINARY NEURAL NETWORK

BACKGROUND

Technical Field

The present invention generally relates to machine learning, and more particularly to inference focus for offline training of a Static Random Access Memory (SRAM) inference engine in a binary neural network.

Description of the Related Art

In the past, GPUs enabled breakthroughs in neural network computation. However, the inference stage is still crucial and challenging for consumer applications on mobile and slim devices. Hence, there is a need for an improved approach to the inference stage for consumer applications on mobile and slim devices.

SUMMARY

According to an aspect of the present invention, a Static Random Access Memory (SRAM) device in a binary neural network is provided. The SRAM device includes an SRAM inference engine having an SRAM computation architecture with a forward path that include multiple SRAM cells. The multiple SRAM cells are configured to form a chain of SRAM cells such that an output of a given one of the multiple SRAM cells is an input to a following one of the multiple SRAM cells. The SRAM computation architecture is configured to compute a prediction from an input.

According to another aspect of the present invention, a computer implemented method is provided for inference training in a neural network. The method includes training an SRAM inference engine having an SRAM computation architecture with a forward path that include multiple SRAM cells. The multiple SRAM cells are configured to form a chain of SRAM cells such that an output of a given one of the multiple SRAM cells is an input to a following one of the multiple SRAM cells. The SRAM computation architecture is configured to compute a prediction from an input.

According to yet another aspect of the present invention, a computer program product is provided for inference training in a neural network. The computer program product includes a non-transitory computer readable storage medium having program instructions embodied therewith. The program instructions are executable by a computer to cause the computer to perform a method. The method includes training an SRAM inference engine having an SRAM computation architecture with a forward path that include multiple SRAM cells. The multiple SRAM cells are configured to form a chain of SRAM cells such that an output of a given one of the multiple SRAM cells is an input to a following one of the multiple SRAM cells. The SRAM computation architecture is configured to compute a prediction from an input.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The present invention is directed to inference focus for offline training of a Static Random Access Memory (SRAM) inference engine in a binary Neural Network (NN).

In an embodiment, characteristics of a neural network such as binary weight and activation, as well as dedicated SRAM computation hardware for Deep Learning (DL), are used in an inference stage of the neural network in order to integrate computation and memory to a device (the dedicated SRAM computation hardware) capable of tolerating large native device variations. In an embodiment, the forward path, including the NN characteristics of both weight and activation, can be binarized (+1/−1). In such a case, the present invention can be used in a binary neural network that has its weights constrained to binary values (+1/−1). In another embodiment, the forward path, including the NN characteristics of both weight and activation, can be ternarized (+1, 0, −1). In such a case, the present invention can be used in a ternary neural network that has its weights constrained to ternary values (+1, 0, −1).

In an embodiment, in consideration that the forward path can be binarized (+1/−1) or ternarized (+1, 0, −1), SRAM computations are applied in the forward path. In an embodiment, training (backward/updates/batch-normalization) is performed offline.

In an embodiment, binary weight and activation are applied and deep learning neural network computation is built in a customized XNOR SRAM array. In such an approach, data does not have to be moved in a neural network computation. Moreover, the nature of neural networks and error correction.

Various embodiments of the present invention have been shown to have a high error tolerance, which can be used to activate device technology such as, for example, but not limited to, nano-device implementations such as, for example, Carbon Nanotube Technology (CNT), or for three-dimensional (3-D) integration (e.g., a 3-D IC and/or chip), or for thin-film flexible electronic devices. Additionally, the present invention can significantly reduce data movement and can be readily applied to low power applications. These and other implementations, technologies, and applications to which the present invention can be applied are readily determined by one of ordinary skill in the art, given the teachings of the present invention provided herein, while maintaining the spirit of the present invention.

Figure 1:
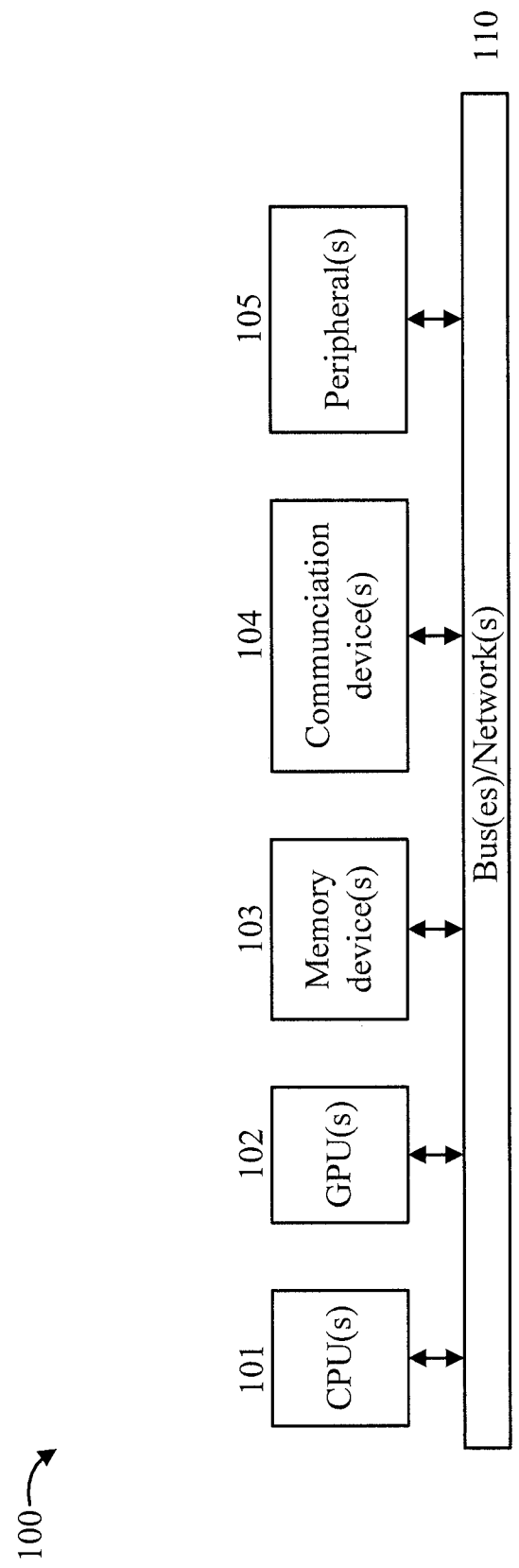
FIG. 1 is a block diagram showing an exemplary processing system to which the present invention may be applied, in accordance with an embodiment of the present invention.

FIG. 1 is a block diagram showing an exemplary processing system 100 to which the present invention may be applied, in accordance with an embodiment of the present invention. The processing system 100 includes a set of processing units (e.g., CPUs) 101, a set of GPUs 102, a set of memory devices 103, a set of communication devices 104, and set of peripherals 105. The CPUs 101 can be single or multi-core CPUs. The GPUs 102 can be single or multi-core GPUs. The one or more memory devices 103 can include caches, RAMs, ROMs, and other memories (flash, optical, magnetic, etc.). The communication devices 104 can include wireless and/or wired communication devices (e.g., network (e.g., WIFI, etc.) adapters, etc.). The peripherals 105 can include a display device, a user input device, a printer, an imaging device, and so forth. Elements of processing system 100 are connected by one or more buses or networks (collectively denoted by the figure reference numeral 110).

It is to be appreciated that one or more elements of system 100 can be implemented using a customized SRAM or SRAM array, in accordance with an embodiment of the present invention.

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. Further, in another embodiment, a cloud configuration can be used. These and other variations of the processing system 100 are readily contemplated by one of ordinary skill in the art given the teachings of the present invention provided herein.

Moreover, it is to be appreciated that various figures as described below with respect to various elements and steps relating to the present invention that may be implemented, in whole or in part, by one or more of the elements of system 100.

Figure 2:
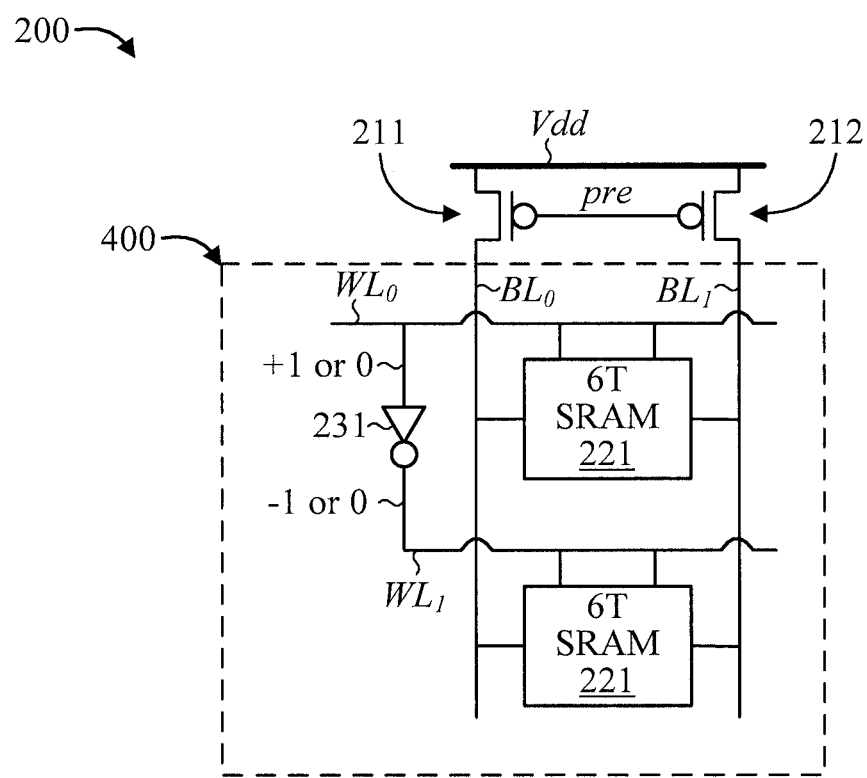
FIG. 2 is a diagram showing an exemplary SRAM computation for inference in a binary neural network, in accordance with an embodiment of the present invention.

FIG. 2 is a diagram showing an exemplary SRAM computation 200 for inference in a binary neural network, in accordance with an embodiment of the present invention.

The SRAM computation 200 is performed on an SRAM 201 having a first transistor 211, a second transistor 212, a first six transistor (6T) SRAM cell 221, a second 6T SRAM cell 222, an inverter 231, bit lines $BL_0$ and $BL_1$, and word lines $WL_0$ and $WL_1$.

The first transistor 211 has a source connected to a voltage Vdd, a drain connected to bit line $BL_0$, and a gate connected to the gate of the second transistor 212. The second transistor 212 has a source connected to the voltage Vdd, and a drain connected to bit line $BL_1$. A signal labeled "PRE", denoting "pre-charging", is shown interconnected to both gates of transistors 211 and 212, where bit lines $BL_0$ and $BL_1$ are pre-charged for a read operation.

Each of the 6T SRAM cells 221 and 222 include four transistors that form cross-coupled inverters and 2 access transistors (not shown). Access to the cells is enabled by the word lines $WL_0$ and $WL_1$ which respectively control the two access transistors of the cells 221 and 222 which, in turn, control whether the cells 221 and 222 should be connected to the bit lines $BL_0$ and $BL_1$, respectively.

The SRAM computation 200 involves receiving input data in binarized form (+1, −1). The SRAM computation 200 can be considered to correspond to a neuron A 290A. A portion 400 of the 6T SRAM cells 221 and 222 are further described with respect to FIG. 4.

Figure 3:
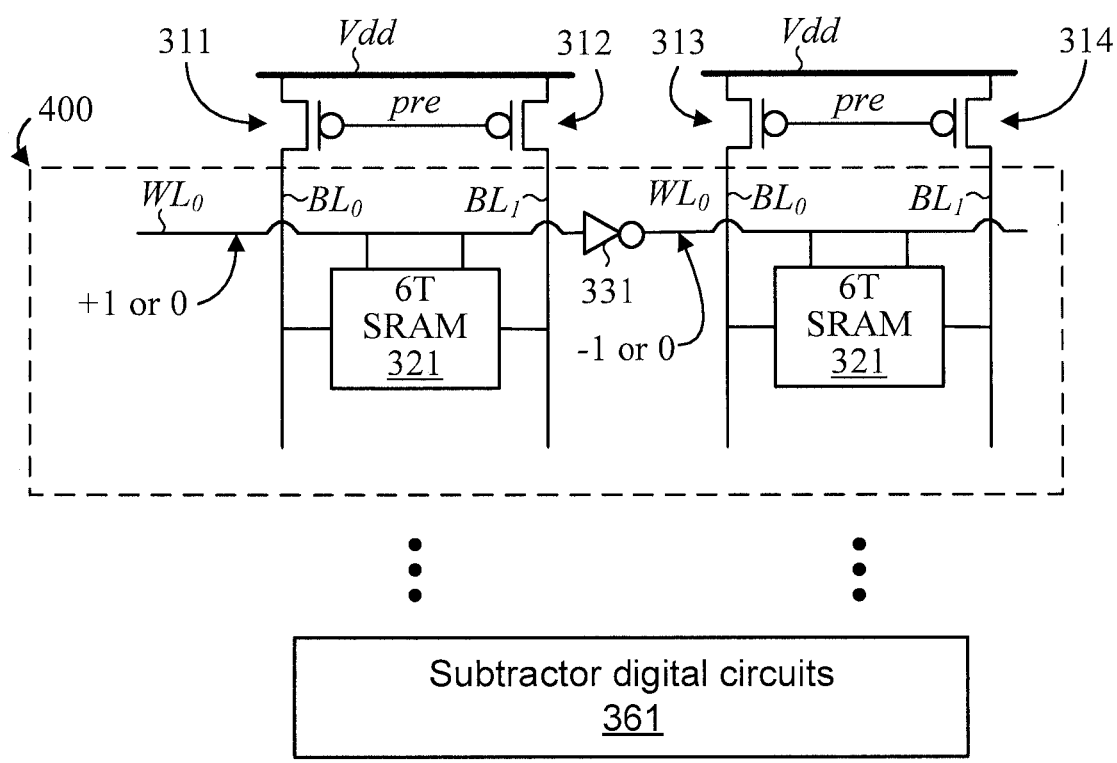
FIG. 3 is a diagram showing an exemplary SRAM computation for inference in a ternary neural network, in accordance with an embodiment of the present invention.

FIG. 3 is a diagram showing an exemplary SRAM computation 300 for inference in a ternary neural network, in accordance with an embodiment of the present invention.

The SRAM computation 300 is performed on an SRAM 301 having a first transistor 311, a second transistor 312, a third transistor 313, a fourth transistor 314, a first six transistor (6T) SRAM cell 321, a second 6T SRAM cell 322, an inverter 331, bit lines $BL_0$, $BL_1$, $BL_3$, and $BL_4$, word lines $WL_0$ and $WL_1$, and subtractor digital circuits 361.

The first transistor 311 has a source connected to a voltage Vdd, a drain connected to bit line $BL_0$, and a gate connected to the gate of the second transistor 312. The second transistor 312 has a source connected to the voltage Vdd, and a drain connected to bit line $BL_1$. A signal labeled "PRE", denoting "pre-charging", is shown interconnected to both gates of transistors 311 and 312, where bit lines $BL_0$, $BL_1$, $BL_3$, and $BL_4$ are pre-charged for a read operation.

Each of the 6T SRAM cells 321 and 322 include four transistors that form cross-coupled inverters and 2 access transistors (not shown). Access to the cells is enabled by the word lines $WL_0$ and $WL_1$ which respectively control the two access transistors of the cells 321 and 322 which, in turn, control whether the cells 321 and 322 should be connected to the bit lines $BL_0$ and $BL_1$, respectively.

The subtractor digital circuits 361 perform subtraction operations on the bit lines.

The SRAM computation 300 involves receiving input data in ternarized form (+1, −1, 0). The SRAM computation 200 can be considered to correspond to a neuron A 390A. A portion 400 of the 6T SRAM cells 321 and 322 are further described with respect to FIG. 4.

Figure 4:
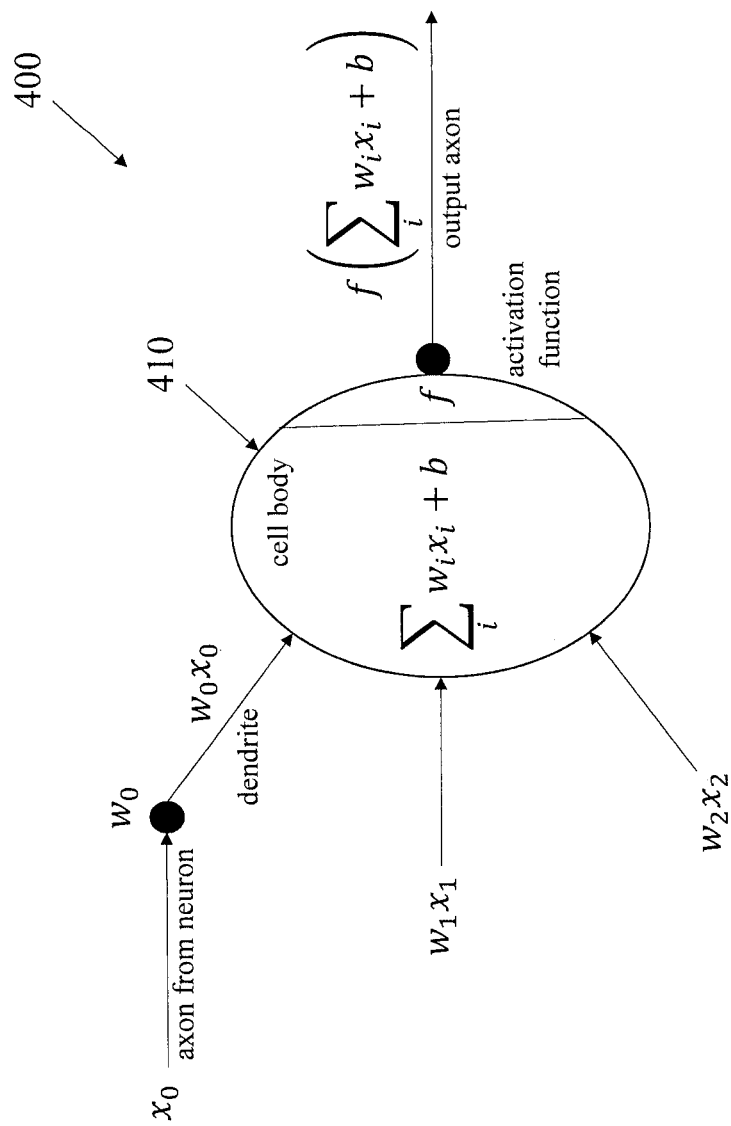
FIG. 4 is a diagram showing an exemplary portion of the 6T SRAM cells of FIG. 2 and 6T SRAM cells of FIG. 3, in accordance with an embodiment of the present invention.

FIG. 4 is a diagram showing an exemplary portion 400 of the 6T SRAM cells 221 and 222 of FIG. 2 and 6T SRAM cells 321 and 322 of FIG. 3, in accordance with an embodiment of the present invention.

As shown, a cell body 410 receives inputs $w_0x_0$, $w_1x_1$, $w_2x_2$. In further detail, inputs $x_0$, $x_1$, and $x_2$ are respectively multiplied by weights $w_0$, $w_1$, $w_2$ are respective synapses originating from an axon to a dendrite.

The cell body 410 implements the following activation function $f$:

$$f = \Sigma_i w_i x_i + b.$$

An output axon 420 outputs a result of the function $f$.

Figure 5:
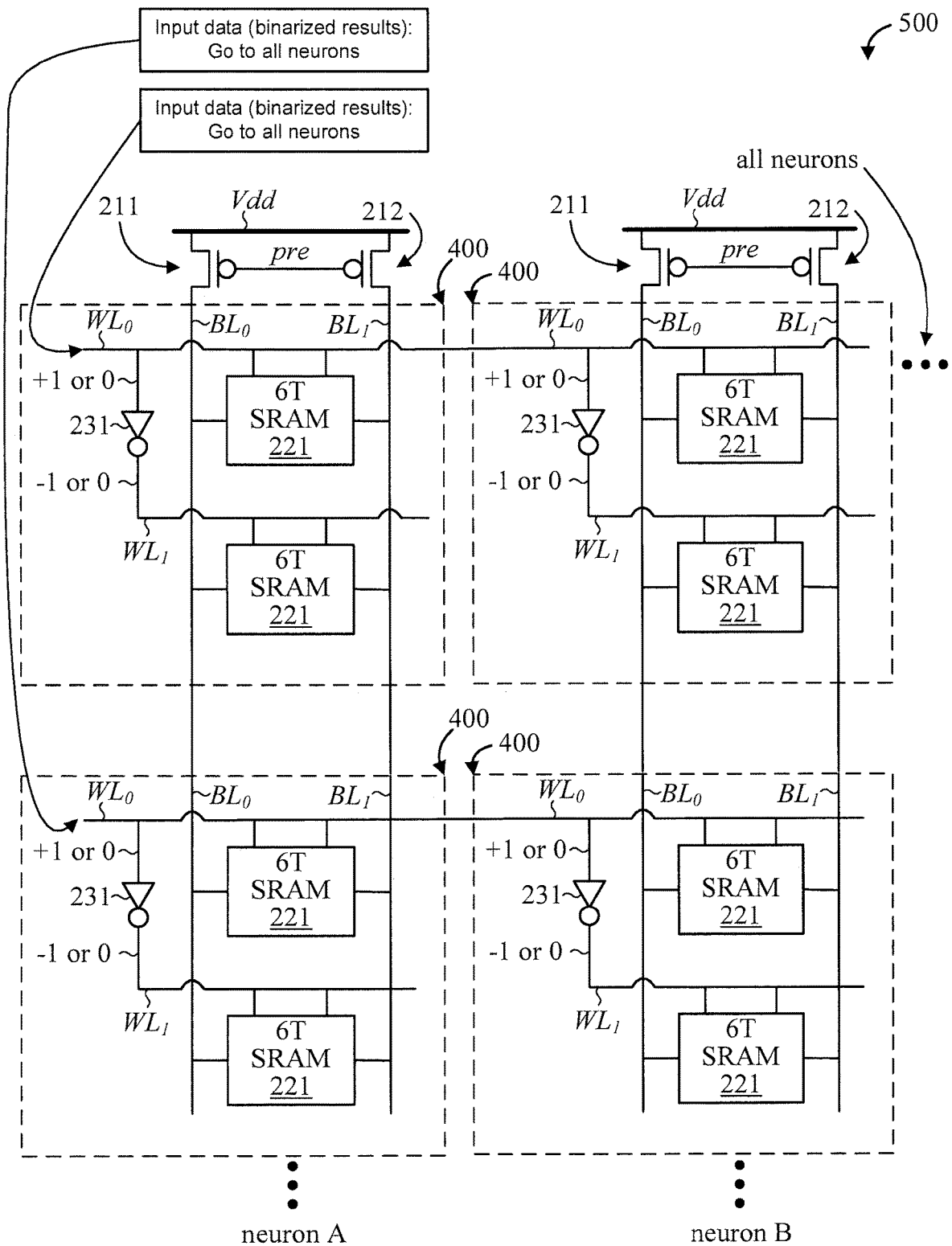
FIG. 5 is a diagram showing an exemplary SRAM computation for inference for an XNOR implementation involving a fully-connected layer, in accordance with an embodiment of the present invention.

FIG. 5 is a diagram showing an exemplary SRAM computation 500 for inference for an XNOR implementation involving a fully-connected layer 580, in accordance with an embodiment of the present invention.

The SRAM computation 500 multiple neurons 590A through 590N. For the sake of illustration, SRAM hardware for neurons 590A and 590B are explicitly shown in detail. For the sake of clarity and consistency, notations from FIG. 2 are used to describe SRAM computation 500 given the use of common elements therebetween.

Each of neuron A 590A and neuron B 590B include: multiple ones of neuron A 290A stacked atop and interconnected to each other. For the sake of illustration, a stack of 2 is shown. However, other numbers of neurons can also be used, depending upon the implementation and corresponding size of the array.

Figure 6:
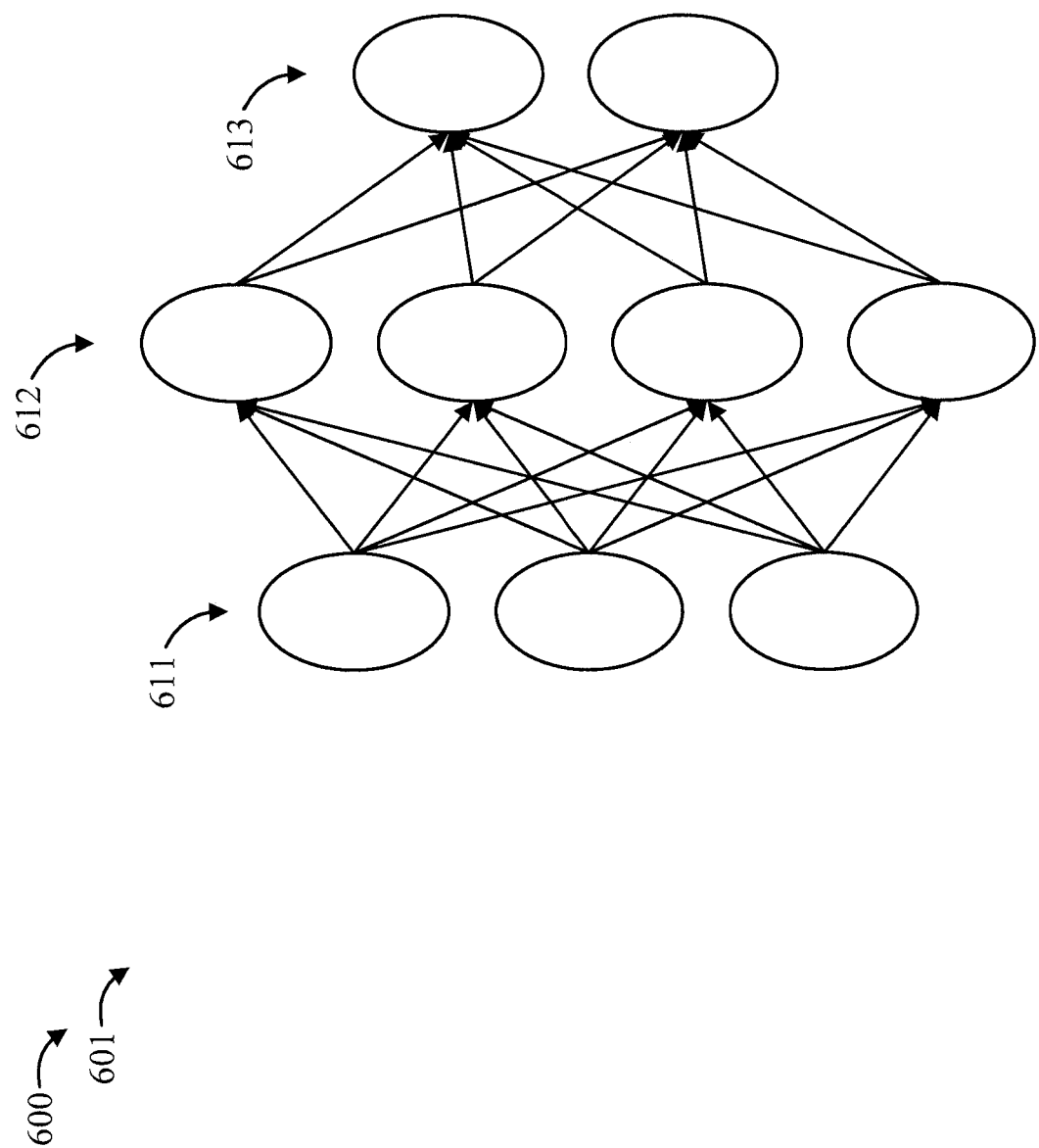
FIG. 6 is a diagram showing an exemplary topology of a neural network with the fully-connected layer of FIG. 5, in accordance with an embodiment of the present invention.

FIG. 6 is a diagram showing an exemplary topology 600 of a neural network 601 with the fully-connected layer 580 of FIG. 5, in accordance with an embodiment of the present invention. The neural network 601 includes an input layer 611, a hidden, fully-connected (FC) layer 612, and an output layer 613.

Figure 7:
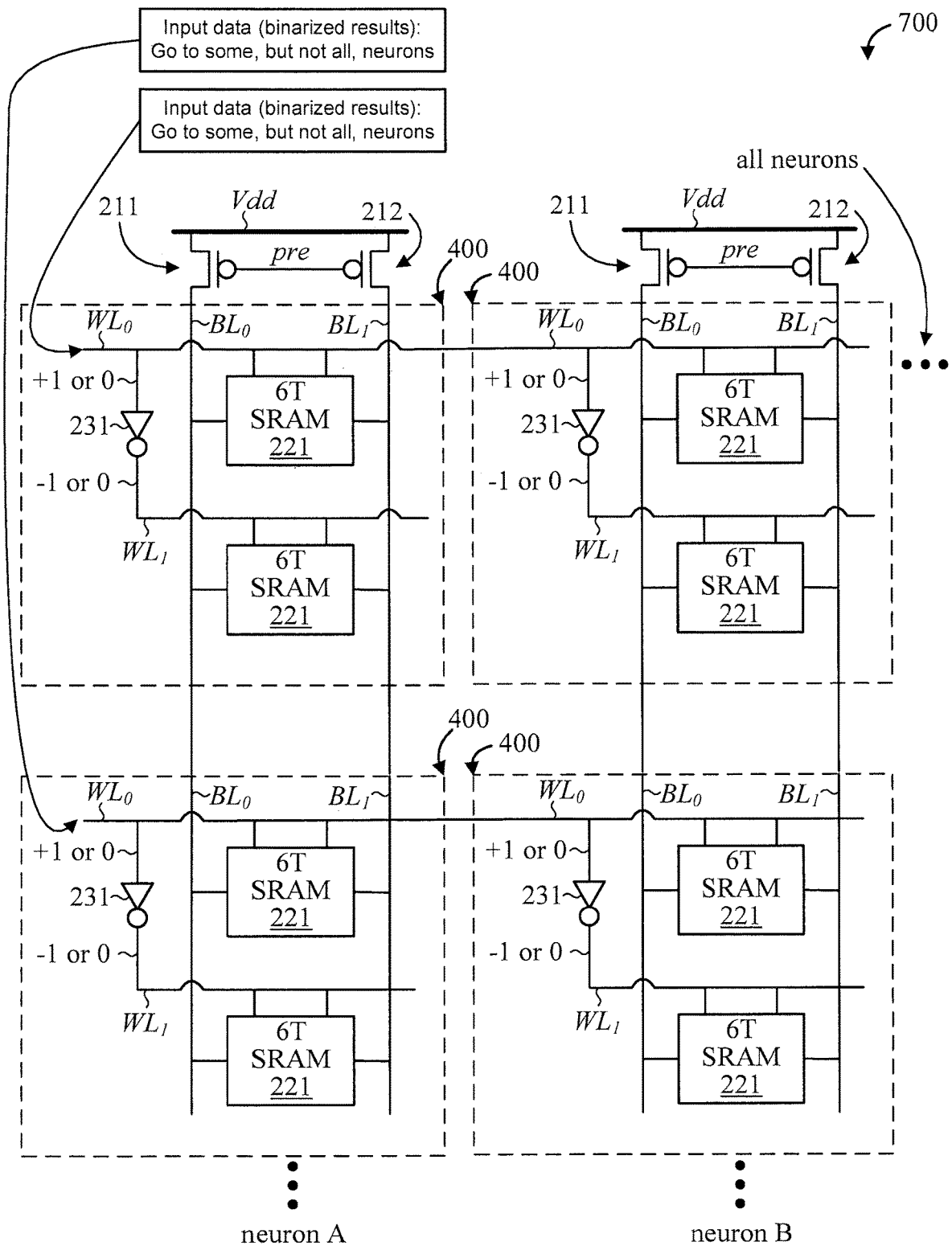
FIG. 7 is a diagram showing an exemplary SRAM computation for inference for an XNOR implementation involving a convolutional layer, in accordance with an embodiment of the present invention.

FIG. 7 is a diagram showing an exemplary SRAM computation 700 for inference for an XNOR implementation involving a convolutional layer 780, in accordance with an embodiment of the present invention.

The SRAM computation 700 multiple neurons 790A through 790N. For the sake of illustration, SRAM hardware for neurons 790A and 790B are explicitly shown in detail. For the sake of clarity and consistency, notations from FIG. 2 are used to describe SRAM computation 700 given the use of common elements therebetween.

Each of neuron A 790A and neuron B 790B include: multiple ones of neuron A 290A stacked atop and interconnected to each other. For the sake of illustration, a stack of 2 is shown. However, other numbers of neurons can also be used, depending upon the implementation and corresponding size of the array.

The convolutional layer 780 of FIG. 7 differs from the fully-connected layer 580 of FIG. 5 in that only some but not all of the neurons of the convolutional layer 780 will receive the same input, while all of the neurons of the fully-connected layer 580 will receive the same input. As an example, an input of 0 can be provide to the 2 SRAM cell if the input does not connect to the neuron.

Figure 8:
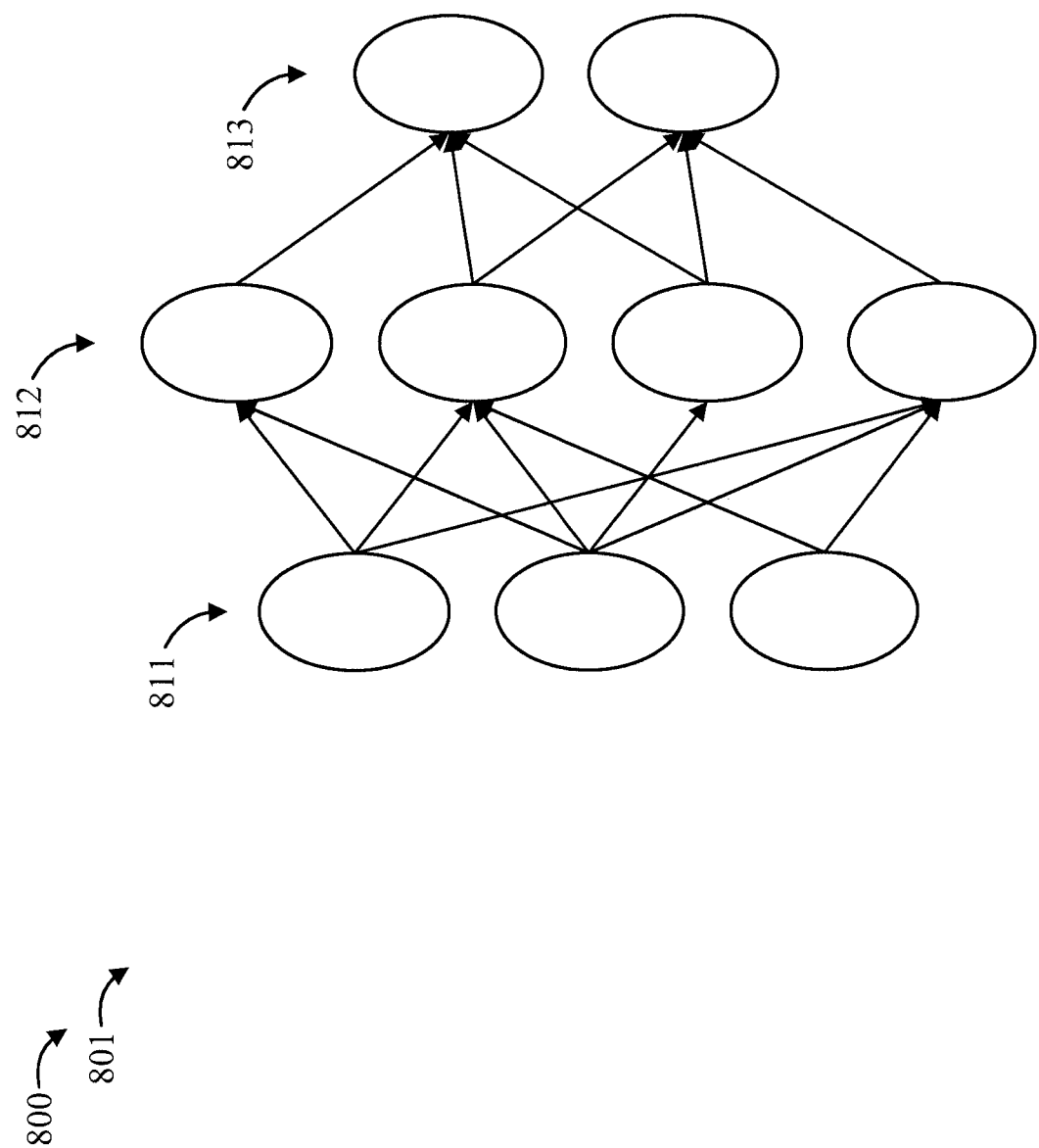
FIG. 8 is a diagram showing an exemplary topology of a neural network with the convolutional layer of FIG. 7, in accordance with an embodiment of the present invention.

FIG. 8 is a diagram showing an exemplary topology 800 of a neural network 801 with the convolutional layer 780 of FIG. 7, in accordance with an embodiment of the present invention. The neural network 801 includes an input layer 811, a hidden, convolutional layer 812, and an output layer 813.

Figure 9:
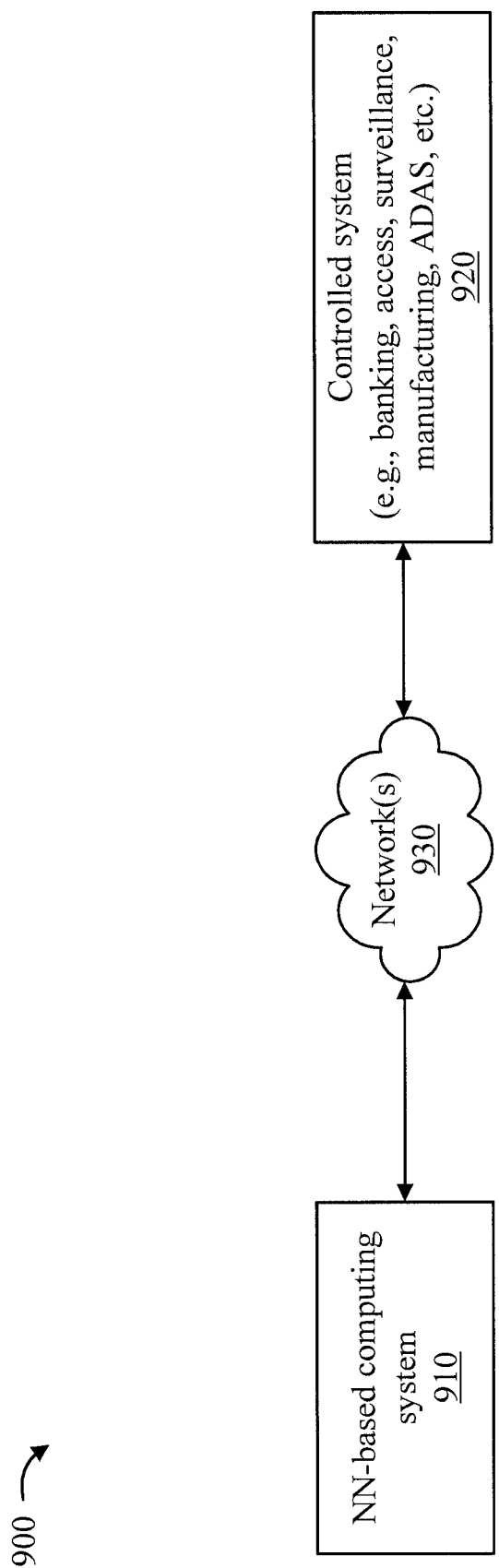
FIG. 9 is a block diagram showing an exemplary environment to which the present invention can be applied, in accordance with an embodiment of the present invention.

FIG. 9 is a block diagram showing an exemplary environment 900 to which the present invention can be applied, in accordance with an embodiment of the present invention.

The environment 900 includes a controlled system 920 and Neural Network (NN)-based computing system 910. The NN-based computing system 910 includes an SRAM computation architecture 911 with a forward path that includes multiple SRAM cells. In the SRAM computation architecture 911, an output of a given one of the multiple SRAM cells is an input to a following (next) one of the multiple SRAM cells. The SRAM computation architecture 911 is configured to compute a prediction from an input.

The NN-based computing system 910 and the controlled system 920 are configured to enable communications therebetween. For example, transceivers and/or other types of communication devices including wireless, wired, and combinations thereof can be used. In an embodiment, communication between the NN-based computing system 910 and the controlled system 920 can be performed over one or more networks, collectively denoted by the figure reference numeral 930. The controlled system 920 can be any type of processor-based system such as, for example, but not limited to, a banking system, an access system, a surveillance system, a manufacturing system (e.g., an assembly line), an Advanced Driver-Assistance System (ADAS), and so forth.

The controlled system 920 provides data (e.g., time-series data or other data) to the NN-based computing system 910 which uses the data for training/learning and to make predictions. The controlled system 920 can be controlled based on a prediction generated by the NN-based computing system 910. For example, based on a forecast that a machine will soon fail (e.g., at time x), a corresponding action (e.g., power down machine, enable machine safeguard to prevent injury/etc., and/or so forth) can be performed at t<x in order to avoid the failure from actually occurring. As another example, based on a trajectory of an intruder, a surveillance system being controlled could lock or unlock one or more doors in order to secure someone in a certain place (holding area) and/or guide them to a safe place (safe room) and/or restrict them from a restricted place and/or so forth. Verbal (from a speaker) or displayed (on a display device) instructions could be provided along with the locking and/or unlocking of doors (or other actions) in order to guide a person. As a further example, a vehicle can be controlled (braking, steering, accelerating, and so forth) to avoid an obstacle that is predicted to be in a car's way responsive to a prediction. As a yet further example, the present invention can be incorporated into a computer system in order to forecast impending failures and take action before the failures occur, such as switching a component that will soon fail with another component, routing through a different component, processing by a different component, and so forth. It is to be appreciated that the preceding actions are merely illustrative and, thus, other actions can also be performed depending upon the implementation, as readily appreciated by one of ordinary skill in the art given the teachings of the present invention provided herein, while maintaining the spirit of the present invention.

In an embodiment, the NN-based computing system 910 can be implemented as a node in a cloud-computing arrangement. In an embodiment, a single NN-based computing system 910 can be assigned to a single controlled system or to multiple controlled systems e.g., different robots in an assembly line, and so forth). These and other configurations of the elements of environment 900 are readily determined by one of ordinary skill in the art given the teachings of the present invention provided herein, while maintaining the spirit of the present invention.

Figure 10:
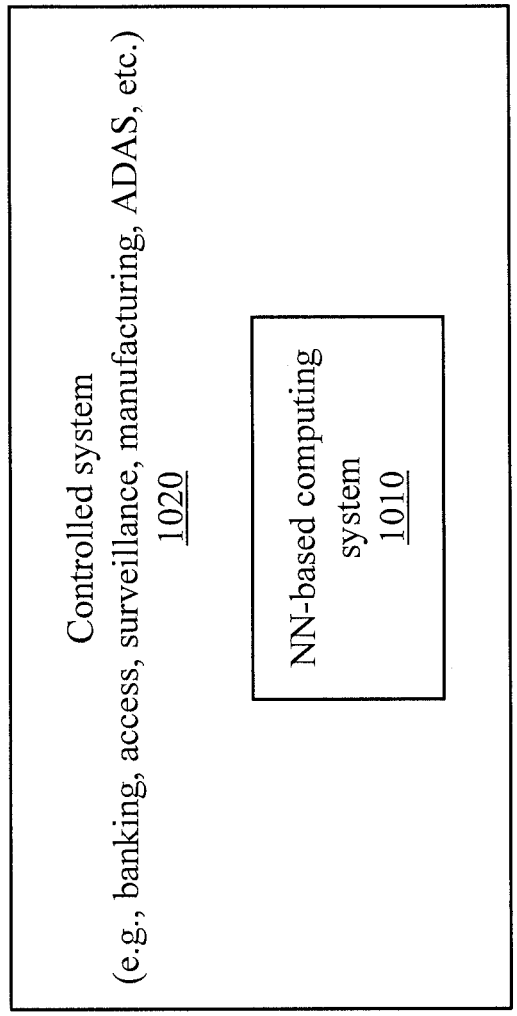
FIG. 10 is a block diagram showing another exemplary environment to which the present invention can be applied, in accordance with an embodiment of the present invention.

FIG. 10 is a block diagram showing another exemplary environment 1000 to which the present invention can be applied, in accordance with an embodiment of the present invention.

The environment 1000 includes a controlled system 1020 that, in turn, includes an NN-based computing system 1010. One or more communication buses and/or other devices can be used to facilitate inter-system, as well as intra-system, communication. The controlled system 1020 can be any type of processor-based system such as, for example, but not limited to, a banking system, an access system, a surveillance system, a manufacturing system (e.g., an assembly line), an Advanced Driver-Assistance System (ADAS), computer processing, and so forth.

Other than system 1010 being included in system 1020, operations of these elements in environments 900 and 1000 are similar. Accordingly, elements 1010 and 1020 are not described in further detail relative to FIG. 10 for the sake of brevity, with the reader respectively directed to the descriptions of elements 910 and 920 relative to environment 900 of FIG. 9 given the common functions of these elements in the two environments 900 and 1000.

Figure 11:
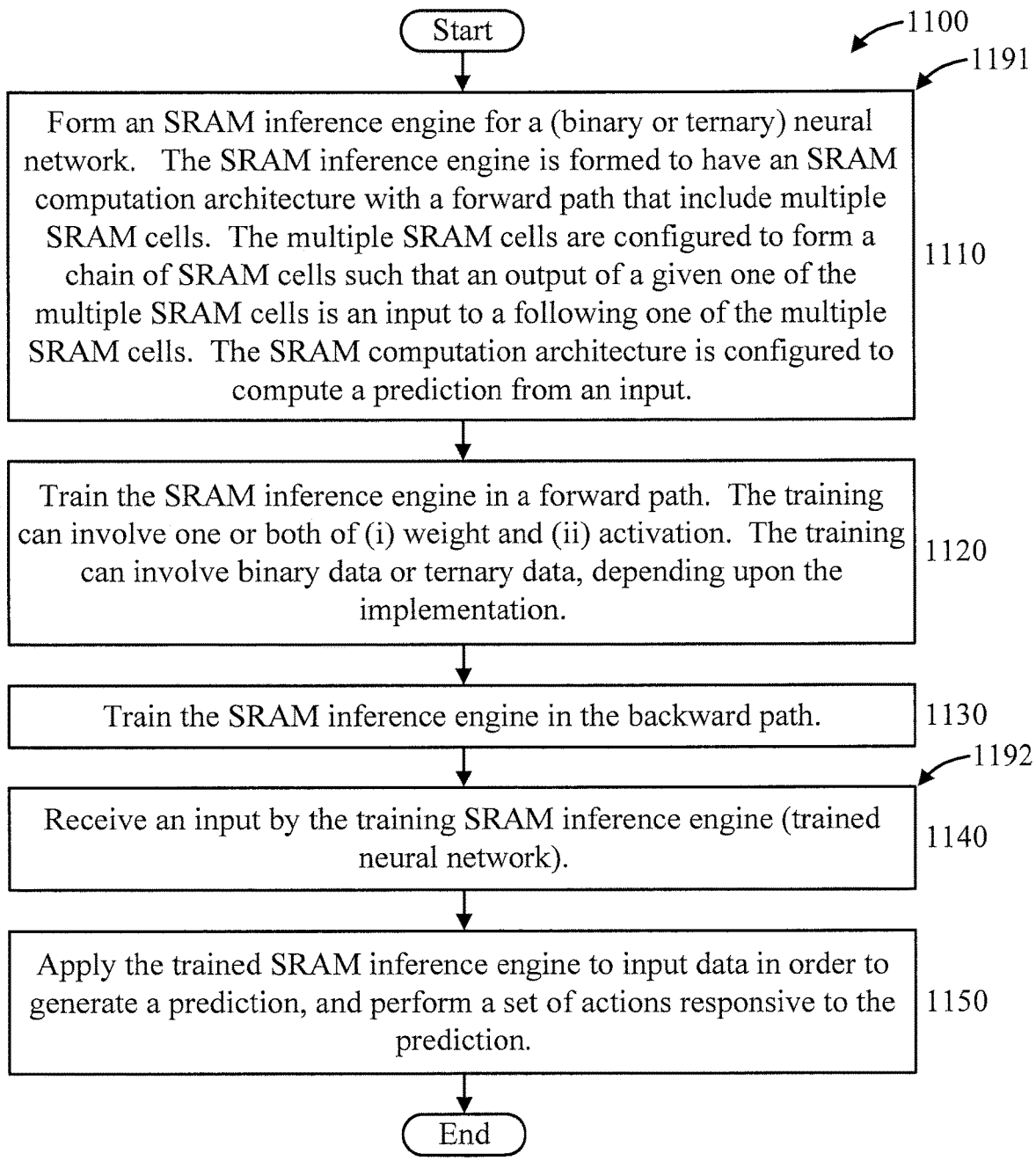
FIG. 11 is a flow diagram showing an exemplary method for SRAM inference in a neural network, in accordance with an embodiment of the present invention.

FIG. 11 is a flow diagram showing an exemplary method 1100 for SRAM inference in a neural network, in accordance with an embodiment of the present invention. Blocks 1110 through 1130 can be considered to correspond to a training stage 1191, while blocks 1140 through 1150 can be considered to correspond to an inference stage 1192.

At block 1110, form an SRAM inference engine for a (binary or ternary) neural network. The SRAM inference engine is formed to have an SRAM computation architecture with a forward path that include multiple SRAM cells. The multiple SRAM cells are configured to form a chain of SRAM cells such that an output of a given one of the multiple SRAM cells is an input to a following one of the multiple SRAM cells. The SRAM computation architecture is configured to compute a prediction from an input.

While block 1110 is described at a high-level, it is to be appreciated that one of ordinary skill in the art can readily form an SRAM inference engine in accordance with the present invention, given the teachings of the present invention provided herein.

At block 1120, train the SRAM inference engine in a forward path. The training can involve one or both of (i) weight and (ii) activation. The training can involve binary data or ternary data, depending upon the implementation.

At block 1130, train the SRAM inference engine in the backward path. As the backward training is beyond the scope the present invention, it is simply mentioned here without more, noting that one of ordinary skill in the art can readily implement such backward path training.

It is to be appreciated that blocks 1120 and 1130 may be performed iteratively until one or more criteria are reached (e.g., convergence, a time constraint, etc.).

At block 1140, receive an input by the training SRAM inference engine (trained neural network).

At block 1150, apply the trained SRAM inference engine to input data in order to generate a prediction, and perform a set of actions responsive to the prediction. As appreciated by one of ordinary skill in the art, the set of actions depends on the implementation. For example, depending upon the type of the controlled system, the action will vary from system type to system type, and so forth. Exemplary actions are described above with respect to FIG. 9.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A Static Random Access Memory (SRAM) device in a binary neural network, comprising:
an SRAM inference engine having an SRAM computation architecture with a forward path that include multiple SRAM cells, wherein the multiple SRAM cells are configured to form a chain of SRAM cells such that an output of a given one of the multiple SRAM cells is an input to a following one of the multiple SRAM cells, the SRAM computation architecture being configured to compute a prediction from an input,
wherein the multiple SRAM cells are arranged in an array to form a convolutional layer in the neural network.

2. The SRAM device of claim 1, wherein the SRAM computation architecture is configured to perform forward path computations on values in local SRAM memory to eliminate data movement from remote memory to perform the forward path computations.

3. The SRAM device of claim 1, wherein the SRAM computation architecture is configured to store binary data and perform local computations on the binary data.

4. The SRAM device of claim 3, wherein the SRAM computation architecture is configured to perform the local computations as forward path computations on the binary data.

5. The SRAM device of claim 4, wherein the forward path computations comprise binary weight computations and activation computations.

6. The SRAM device of claim 1, wherein the SRAM computation architecture is configured to store ternary data and perform local computations on the ternary data.

7. The SRAM device of claim 6, wherein the SRAM computation architecture is configured to perform the local computations as forward path computations on the ternary data.

8. The SRAM device of claim 7, wherein the forward path computations comprise ternary weight computations and activation computations.

9. The SRAM device of claim 1, wherein each of the multiple SRAM cells are six transistor SRAM cells.

10. The SRAM device of claim 1, wherein the multiple SRAM cells are arranged in an array to form a fully-connected layer in the neural network.

11. The SRAM device of claim 1, wherein a zero value is input to any of the multiple SRAM cells that are unconnected to a neuron.

12. The SRAM device of claim 1, wherein the SRAM computation architecture is configured to at least perform XNOR computations for a forward path of the neural network.

13. The SRAM device of claim 1, wherein at least a portion of the SRAM computation architecture uses carbon nanotube technology.

14. The SRAM device of claim 1, wherein the SRAM computation architecture is comprised in a three-dimensional integrated circuit chip.

15. A computer implemented method for inference training in a neural network, comprising:
- training an SRAM inference engine having an SRAM computation architecture with a forward path that include multiple SRAM cells, wherein the multiple SRAM cells are configured to form a chain of SRAM cells such that an output of a given one of the multiple SRAM cells is an input to a following one of the multiple SRAM cells, the SRAM computation architecture being configured to compute a prediction from an input,
- wherein the multiple SRAM cells are arranged in an array to form a convolutional layer in the neural network.

16. The computer-implemented method of claim 15, further comprising configuring the SRAM computation architecture to perform forward path computations on values in local SRAM memory to eliminate data movement from remote memory to perform the forward path computations.

17. The computer-implemented method of claim 15, wherein the SRAM computation architecture is configured to store binary data and perform local computations on the binary data.

18. The computer-implemented method of claim 17, wherein the SRAM computation architecture is configured to perform the local computations as forward path computations on the binary data.

19. A computer program product for inference training in a neural network, the computer program product comprising a non-transitory computer readable storage medium having program instructions embodied therewith, the program instructions executable by a computer to cause the computer to perform a method comprising:
- training an SRAM inference engine having an SRAM computation architecture with a forward path that include multiple SRAM cells, wherein the multiple SRAM cells are configured to form a chain of SRAM cells such that an output of a given one of the multiple SRAM cells is an input to a following one of the multiple SRAM cells, the SRAM computation architecture being configured to compute a prediction from an input,
- wherein the multiple SRAM cells are arranged in an array to form a convolutional layer in the neural network.

* * * * *